United States Patent
Ueno et al.

(10) Patent No.: US 6,504,140 B1
(45) Date of Patent: Jan. 7, 2003

(54) OPTICAL INTERCONNECTION RECEIVING MODULE

(75) Inventors: Satoshi Ueno, Ome (JP); Nobuhiro Shiramizu, Kokubunji (JP); Kiyoshi Hayashi, Takamatsu (JP); Takashi Harada, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 91 days.

(21) Appl. No.: 09/642,584

(22) Filed: Aug. 22, 2000

(30) Foreign Application Priority Data

Aug. 27, 1999 (JP) .......................................... 11-240864

(51) Int. Cl.[7] .............................................. H01L 31/00
(52) U.S. Cl. .............................. 250/214 R; 250/214 C; 359/193
(58) Field of Search ........................ 250/214 C, 214 R, 250/214 LA, 214 A; 257/443, 444; 359/193, 109, 154; 327/514, 515

(56) References Cited

U.S. PATENT DOCUMENTS

| | | | |
|---|---|---|---|
| 5,432,470 A | * 7/1995 | Sasaki | 327/514 |
| 5,652,425 A | * 7/1997 | Sawada et al. | 250/214 A |
| 5,892,609 A | * 4/1999 | Saruwatari | 359/193 |
| 6,166,839 A | * 12/2000 | Yamaguchi | 359/161 |
| 6,304,357 B1 | * 10/2001 | Ohhata et al. | 359/194 |
| 6,307,196 B1 | * 10/2001 | Thompson et al. | 250/214 A |
| 6,342,694 B1 | * 1/2002 | Satoh | 250/214 A |

FOREIGN PATENT DOCUMENTS

JP       08139342 A  *  5/1996  ........... H01L/31/02

* cited by examiner

Primary Examiner—Kevin Pyo
Assistant Examiner—Seung C. Sohn
(74) Attorney, Agent, or Firm—Antonelli, Terry, Stout & Kraus, LLP (57) ABSTRACT

The present invention provides an optical interconnection receiving module that can cancel out the effect of cross talk noise caused by the input signal of another channel on the preamplifier side and the reference amplifier side, and provides suitable device structures for a bypass capacitor used to stabilize supply voltage and for a capacitance device used to cancel out the effect of cross talk noise caused by the input signal of another channel on the preamplifier side and on the reference amplifier side. According to the present invention, there are provided: a photodiode array comprising a plurality of photodiodes, each of which receives an optical signal on a plurality of channels and converts the optical signal into an electric signal; and a receiving circuit for distinguishing an input signal which comprises: a preamplifier for amplifying the electric signal converted from the optical signal by the photodiode array for each of the channels; a comparator; and a reference amplifier for generating reference voltage, wherein a plurality of capacitance devices each equivalent to the photodiode are formed on the semiconductor chip where the receiving circuit is formed, and each of the equivalent capacitance devices is connected between the input terminal of the reference amplifier and a supply voltage terminal.

20 Claims, 8 Drawing Sheets

OPTICAL INTERCONNECTION RECEIVING MODULE

BACKGROUND OF THE INVENTION

1. Field of the Invention

The present invention relates to an optical interconnection receiving module. The present invention particularly relates to a technology for preventing the effect of cross talk noise caused by an amplifier of another channel in a photoelectric conversion circuit dealing with a plurality of channel signals and an optical interconnection receiving module including the photoelectric conversion circuit. The optical interconnection receiving module according to the present invention is used in an optical communication system, and is useful in converting an optical signal into an electric signal and in amplifying and distinguishing the electric signal.

2. Related Arts

Figure 1:
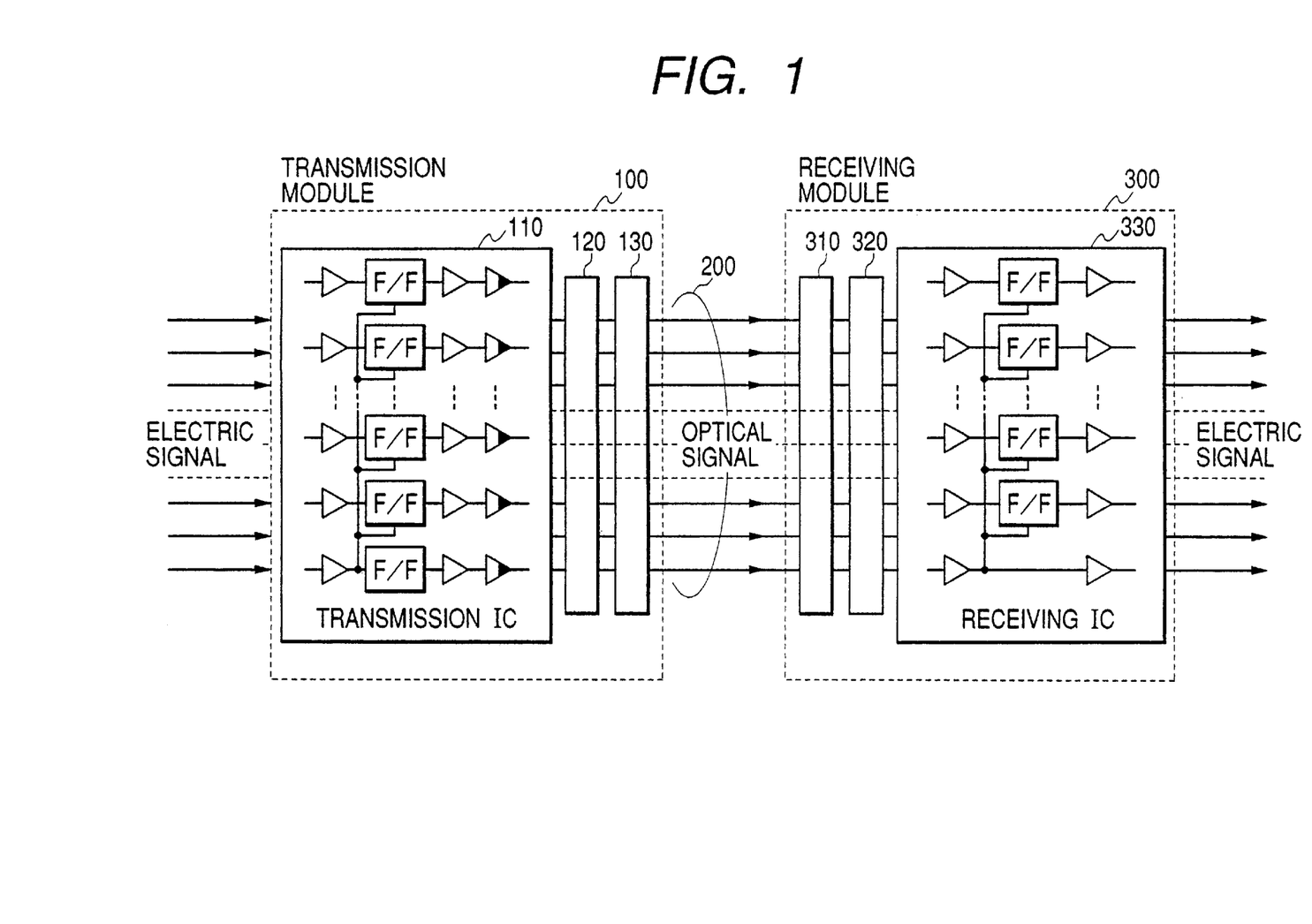
FIG. 1 is a block diagram showing a configuration of a multi-channel optical signal receiving module according to the present invention.

Conventionally, as shown in FIG. 1, at an apparatus on the transmitting side in an optical communication system, information to be transmitted is converted from an electric signal to an optical signal by a transmission module 100 having a laser diode array 120 and the like, and the information is transmitted to an apparatus on the receiving side via an optical fiber array 200. At the apparatus on the receiving side, the optical signal received by an optical interconnection receiving module 300 having a photodiode array 320 and the like is converted to an electric signal and sent to an interface circuit of a microcomputer system and the like.

Figure 9:
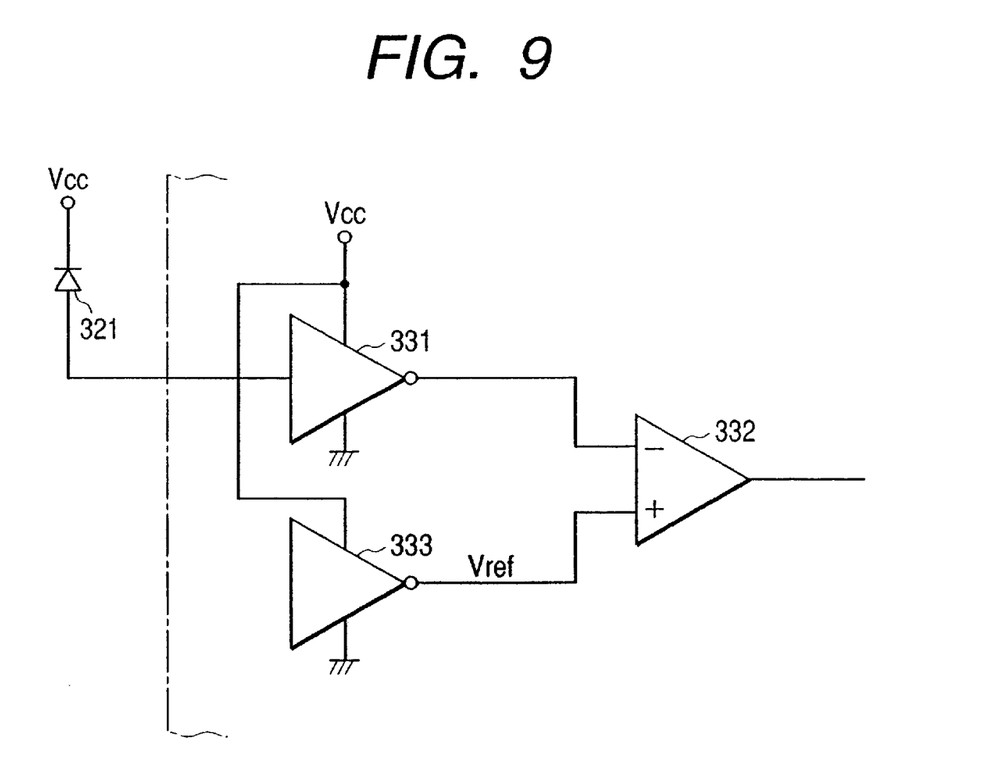
FIG. 9 is a circuit configuration diagram showing an example of a common input distinguishing circuit in an optical interconnection receiving module.

FIG. 9 shows a basic configuration of an input distinguishing circuit IDC provided on the input terminal side of a receiving IC (semiconductor integrated circuit) in the optical interconnection receiving module 300. In the input distinguishing circuit shown in the figure, an electric signal converted from an optical signal by a photodiode 321 is amplified at a preamplifier 331 and supplied to a comparator 332. At the comparator 332, the signal is compared with reference voltage Vref to be distinguished as or "1". Also, an amplifier 333 having the same type of circuit as that of the preamplifier 331 is used as a circuit for generating the reference voltage Vref. This makes it possible to provide high resistance to power supply noise.

It is possible to provide high resistance to power, supply noise for the following reason. If the amplifier 333 for generating the reference voltage Vref has the same type of circuit as that of the preamplifier 331, the noises accompanying the two inputs from the two amplifiers to the comparator 332 are in phase with each other. Therefore, the effect of supply voltage noise will not appear in the output of the.comparator 332. Specifically, in the case where the reference amplifier 333 has the same type of circuit as that of the preamplifier 331, even if noise appears in the output of the preamplifier 331 due to the effect of the noise carried with the supply voltage Vcc, the same noise also appears in the output of the reference amplifier 333, which is supplied with the common supply voltage Vcc. Therefore, the relative correlation between the two inputs of the comparator 332 is not changed, that is, the noises accompanying the two inputs from the two amplifiers to the comparator 332 are in phase with each other. Thus, no effect of, supply voltage noise will appear in the output of the comparator 332.

Figure 10A:
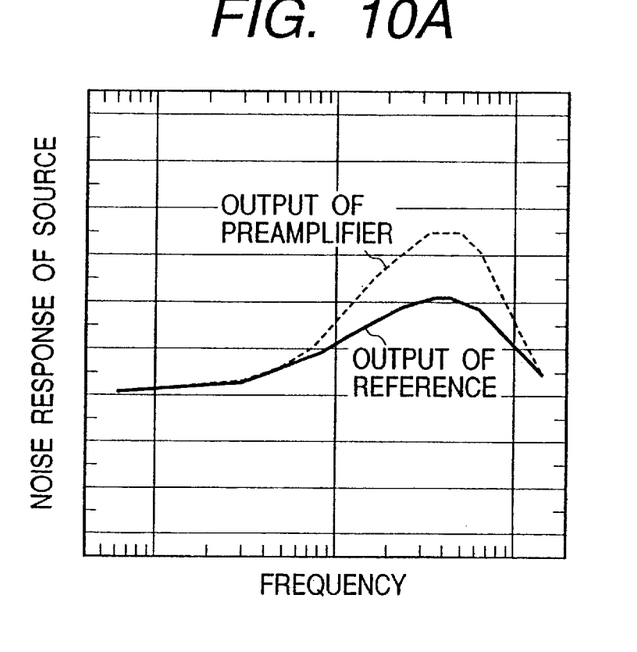
FIG. 10A is a characteristic description graph showing the frequency response characteristics of a preamplifier and a reference amplifier constituting the input distinguishing circuit as shown in FIG. 9.

However, in the circuit shown in FIG. 9, the input terminal of the preamplifier 331 is connected with the photodiode 321, while the input terminal of the reference amplifier 333 is not connected with the photodiode 321. Therefore, the circuit shown in FIG. 9 is not perfectly symmetrical. Thus, it is equivalent to the fact that a capacitance is connected between the input terminal of the preamplifier 331 and the supply voltage terminal Vcc, and no capacitance is connected to the input terminal of the reference amplifier 333. Therefore, power supply noise comes into the input terminal of the preamplifier 331 via the photodiode 321, while such supply voltage noise does not come into the input terminal of the reference amplifier 333. Specifically, in terms of alternating current, the input frequency response characteristic of the preamplifier 331 and the input frequency response characteristic of the reference amplifier 333 with respect to power supply noise differ from each other, as shown in FIG. 10A. In the figure, a dotted line denotes the frequency characteristics of the output of the preamplifier, while a solid line denotes the frequency characteristics of the output of the reference amplifier. Thus, in the circuit shown in FIG. 9, the response to cross talk noise caused by the input distinguishing circuit of another channel differs between the preamplifier 331 and the reference amplifier 333. As a result, as the cross talk noise is increased, the noise that has come into the preamplifier 331 might cause the output of the preamplifier 331 to exceed the reference voltage Vref supplied from the reference amplifier 333, and the comparator 332 might wrongly distinguish the signal.

It is desirable especially in a module that receives a plurality of channel signals to have a receiving semiconductor integrated circuit that can deal with a wide range of input signals, including a small input signal that causes a current of a few $\mu$A to flow through the photodiode as well as a large input signal that causes a current of a few mA to flow through the photodiode. However, on a channel where a large signal comes in, a current of a few mA flows through the bonding wire that connects the power supply terminal and the photodiode, and therefore a relatively large noise occurs in the supply voltage due to the inductance component of the bonding wire. The circuit needs to be designed in such a way that it can correctly distinguish signals even when the noise mentioned above comes through a power supply line into the preamplifier and the reference amplifier of a channel where only a current of a few $\mu$A flows.

Incidentally, regarding a module for photoelectric conversion, there is proposed an invention according to which a capacitance equivalent to that of the photodiode is connected between the input terminal of a dummy amplifier and the supply voltage terminal, so that the effect of noise attributed to variations in power supply and temperature can be cancelled out by the preamplifier side and the dummy amplifier side. An example of this is found in, for example, Japanese Patent Laid-open No. Hei 8-139342. Incidentally, the dummy amplifier mentioned above corresponds to the reference amplifier according to the present invention. The invention mentioned above is similar to the present invention in that the effect of noise is cancelled out, but it does not take into consideration a module that receives multi-channel signals. Thus, the embodiments of the above invention were not sufficient in terms of the prevention of the effect of cross talk noise produced from a channel where a large current of a few mA flows to a channel where only a small current of a few $\mu$A flows. Moreover, according to the prior invention mentioned above, a discrete capacitor is used as equivalent capacitance connected to the input terminal of the dummy amplifier, and therefore the above invention has the disadvantage of increasing the size of the module. The resulting size of a multi-channel module, in particular, may be fatally large for a product.

An object of the present invention is to provide an optical interconnection receiving module that can accurately distinguish an input signal by canceling out the effect of cross talk noise caused by the input signal of another channel on the preamplifier side and the reference amplifier side.

Another object of the present invention is to provide suitable device structures for a bypass capacitor used to stabilize supply voltage and for a capacitance device used to cancel out the effect of cross talk noise caused by the input signal of another channel on the preamplifier side and on the reference amplifier side, and thus reduce the size of the optical interconnection receiving module.

The above and other objects and new features of the present invention will be made clear from the descriptions of the present specification and the accompanying drawings.

SUMMARY OF THE INVENTION

Typical aspects of the present invention disclosed herein will be summarized as follows.

Specifically, according to a first typical aspect of the present invention, there are provided: a photodiode array comprising a plurality of photodiodes, each of which receives an optical signal on a plurality of channels and converts the optical signal into an electric signal; a preamplifier for amplifying the electric signal converted from the optical signal by the photodiode array for each of the channels; a comparator for distinguishing the amplified received signal; and a reference amplifier comprising the same type of circuit as that of the preamplifier which generates reference voltage supplied to the comparator; wherein at least the preamplifier, the comparator, and the reference amplifier are formed on a single semiconductor chip; and wherein a plurality of capacitance devices each equivalent to the photodiode are formed on the semiconductor chip, and each of the equivalent capacitance devices is connected between the input terminal of the reference amplifier and a supply voltage terminal.

According to the means mentioned above, even if cross talk noise caused by the input signal of another channel comes into the preamplifier via the photodiode, the noise of the same magnitude as that of the cross talk noise comes into the reference amplifier. Therefore, the noises of the inputs of the comparator are in phase with each other. Thus, the two noises on the preamplifier side inputted to the preamplifier and on the reference amplifier side cancel out each other, thereby allowing the received signal amplified by the preamplifier to be accurately distinguished. In addition, the equivalent capacitance device connected to the input terminal of the reference amplifier is formed on the semiconductor chip where the preamplifier, the comparator, and the reference amplifier are formed, thereby making it possible to reduce the size of the module.

More specifically, according to another typical aspect of the present invention, multi-layer wiring technology is used whereby a power supply line is formed with a first wiring layer along the edge of the semiconductor chip, that is, in a region outside of where a signal input pad is formed on the semiconductor chip on which a receiving circuit including the preamplifier, the comparator, and the reference amplifier is formed; whereby a part of the power supply line is provided with a section extended to the input terminal side of the reference amplifier; and whereby the equivalent capacitance device is formed by placing a dummy pad, which is connected to the input terminal of the reference amplifier and comprised in a second wiring layer located above the first wiring layer, in such a manner as to face opposite to the redundant section with an insulating film intermediate between the dummy pad and the redundant section. This makes it possible to make the receiving module more compact in configuration than when an external capacitor is used as the equivalent capacitance device connected to the input terminal of the reference amplifier. Furthermore, the size of the chip is not greatly increased because limited chip space is used effectively. The means described above are extremely effective in reducing the size of a module especially when they are applied to a module that receives multi-channel optical signals.

According to yet another typical aspect of the present invention, the following structure is used. Specifically, an SOI substrate (Silicon On Insulator substrate) is first used as a semiconductor chip on which a receiving circuit including the preamplifier, the comparator, and the reference amplifier is formed. The SOI substrate is formed by laminating semiconductor layers, in which the receiving circuit is formed, on a substrate serving as the base with an insulating film intermediate between the substrate and the semiconductor layers. Then a first supply voltage terminal is connected to the substrate serving as the base, and a second supply voltage terminal is connected to the semiconductor region where devices comprising the receiving circuit including the preamplifier, the reference amplifier, and the like are formed. The capacitance formed between the semiconductor region and the substrate serving as the base is configured to function as a bypass capacitor for stabilizing the supply voltage.

In a receiving circuit constituting the receiving module, the preamplifier and the reference amplifier are arranged in accordance with the pitch of each diode in the photodiode array. Therefore, amplifiers for each channel will be formed in a region with relatively large room. Thus, the capacitance formed between the base substrate and the semiconductor region in the SOI substrate where devices comprising the reference amplifier are formed has a relatively large capacitance value large enough for the capacitance to function as a bypass capacitor. Therefore, it is possible to realize a bypass capacitor having a large capacitance value without increasing the original chip size.

In addition, preferably, the preamplifier and the reference amplifier are formed by a current-input and voltage-output type amplifier circuit comprising: a grounded-emitter type bipolar transistor with its base terminal connected to a signal input terminal; a collector resistance connected between the collector terminal of the transistor and a first supply voltage terminal; an emitter-follower transistor with its base connected to the collector terminal of the transistor; an emitter resistance connected between the emitter terminal of the emitter-follower transistor and a second supply voltage terminal; and a feedback resistance connected between the emitter terminal of the emitter-follower transistor and the signal input terminal.

This makes it possible for the preamplifier to operate in a stable manner even when the supply voltage of the circuit is at a relatively low level and to perform amplification for current input with a wide range of current amplitudes. Therefore, the comparator operates accurately even if there are variations between devices in the photodiode array and the like. Also, accurate operation is ensured even if the amplitude of input signals is reduced due to performance changes with time. As a result, the reliability of the module is improved.

Moreover, it is desirable that a microlens array with a plurality of lenses that are capable of collecting the light of a received optical signal for each photodiode and irradiating the photodiode with the light be provided in the proximity of the photodiode array. Since the receiving circuit, the photodiode array, and the microlens array are formed integrally with one another, this makes it possible to further reduce the size of the optical interconnection receiving module, which processes optical signals on a plurality of channels.

Furthermore, a fiber fixing section for fixing one end of an optical fiber is provided for the microlens array in one section of the package where the photodiode array and the receiving circuit are mounted. This makes it possible to connect and fix an optical fiber to the module very easily.

DETAILED DESCRIPTION OF THE PREFERRED EMBODIMENTS

The preferred embodiments of the present invention will now be described with reference to the accompanying drawings.

FIG. 1 is a schematic view of an optical communication system using an optical interconnection receiving module according to the present invention. At an apparatus on the transmitting side, information to be transmitted is converted from an electric signal to an optical signal by a transmission module 100 with a laser diode array 120 and the like, and is transmitted to an apparatus on the receiving side via an optical fiber array 200. At the apparatus on the receiving side, the optical signal received by an optical interconnection receiving module 300 with a photodiode array 320 and the like is converted into an electric signal. The electric signal is amplified to be distinguished and sent to an interface circuit of a microcomputer system or the like.

In FIG. 1, reference numeral 110 denotes an IC for the transmission module (semiconductor integrated circuit), and reference numeral 130 denotes a microlens array. The IC 110 for the transmission module is provided with signal buffer circuits and flip-flops for latching signals and the like. For each channel, the IC 110 for the transmission module creates a signal for driving the corresponding diode in the laser diode array 120 based on the electric signal that carries information to be transmitted. Furthermore, the microlens array 130 collects light generated by each of the diodes in the laser diode array 120 to make the light incident on the corresponding fiber in the optical fiber array 200.

In addition, reference numeral 310 denotes a microlens array on the receiving side which collects the light transmitted through the optical fiber array 200 and irradiates the corresponding diode in a photodiode array 320 with the collected light. Reference numeral 330 denotes an IC for the receiving module which is provided with amplifiers for amplifying and distinguishing for each channel an electric signal converted from an optical signal at the photodiode array 320 as well as latching flip-flops.

Figure 2:
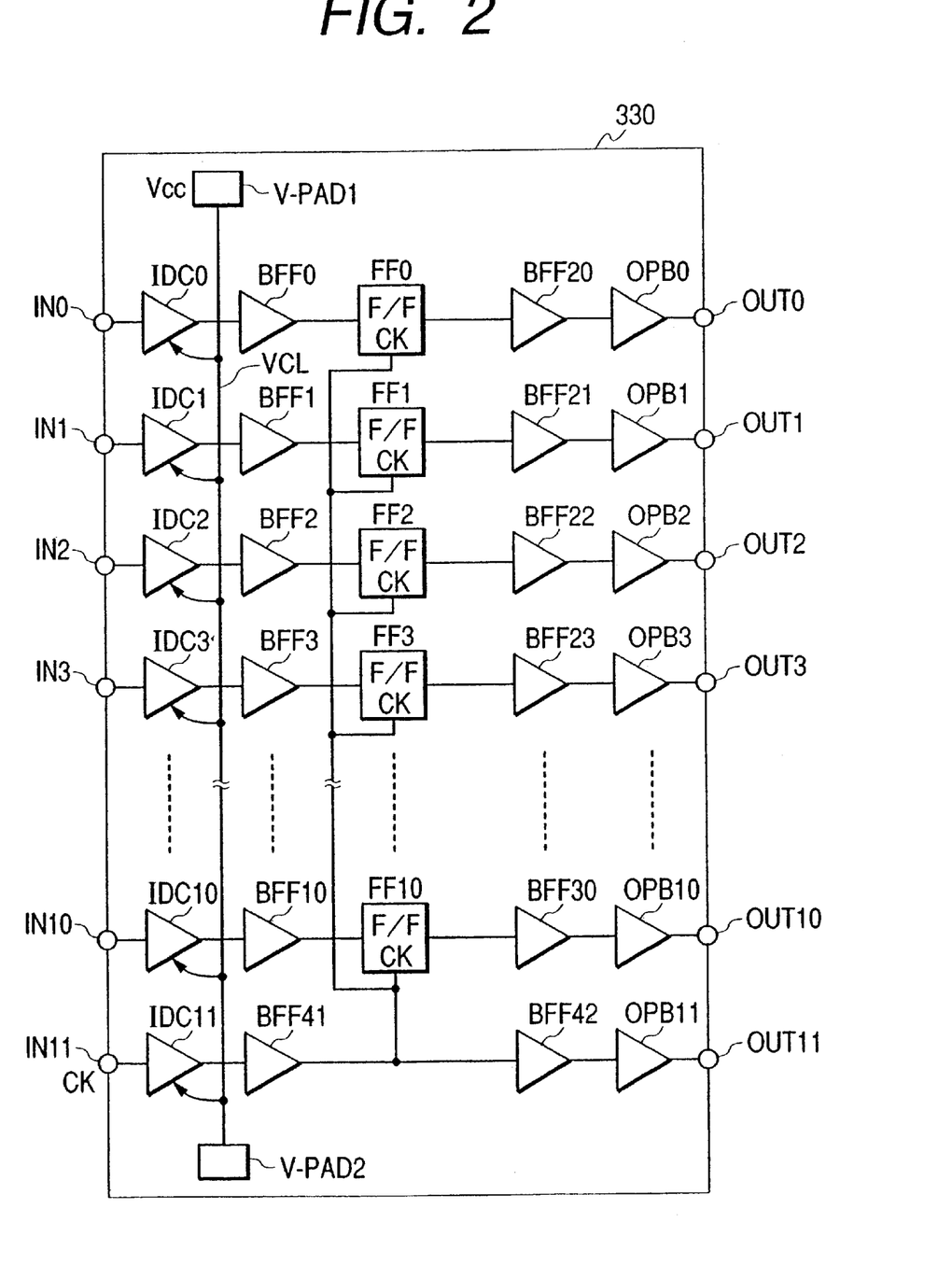
FIG. 2 is a circuit configuration diagram showing an embodiment of a receiving circuit constituting a multi-channel receiving module according to the present invention.

FIG. 2 is a configuration diagram of a receiving semiconductor integrated circuit that forms the multi-channel receiving module to which the present invention is applied. Devices shown in FIG. 2 that form each circuit, such as bipolar transistors, are formed on a common semiconductor chip such as single-crystal silicon in many cases. It should be added, however, that this typical example is not intended to expressly limit embodiments of the present invention.

FIG. 2 is a configuration diagram of an embodiment of a receiving circuit forming the multi-channel receiving module according to the present invention. A frame 330 denotes the area of the semiconductor integrated circuit for the receiving module. The example of the receiving semiconductor integrated circuit in this embodiment is connected with a photodiode which converts optical signals for 11 channels into electric signals. The example of the receiving semiconductor integrated circuit in this embodiment is also provided with signal input terminals IN0 to IN10 to which the current resulting from the above conversion is inputted, as well as a clock input terminal IN11 to which an electric signal is inputted as clock signal which has been transmitted as an optical signal, as in the case of the above optical signals, and converted by the photodiode. The example of the receiving semiconductor integrated circuit in this embodiment is further provided with terminals OUT0 to OUT11 for outputting signals resulting from the amplifying and distinguishing of the above input signals. Incidentally, it should be added that the specific circuit configuration shown here as an example is not intended to expressly limit the present invention.

Also, there are provided inside the chip input distinguishing circuits IDC0 to IDC11, flip-flops FF0 to FF10, output buffers OPB0 to OPB11, pre-buffer circuits BFF0 to BFF10 post-buffer circuits BFF20 to BFF30, and buffer circuits BFF41 and 42 in two stages.

The input distinguishing circuits IDC0 to IDC11 amplify each of the signals-inputted from the terminals IN0 to IN11 and distinguish it as "0" or "1". The flip-flops FF0 to FF10 latch the distinguished input signals in sync with the clock signal reproduced by the input distinguishing circuit IDC11.

The output buffers OPB0 to OPB11 output the distinguished signals from the terminals OUT0 to OUT11 to the outside of the chip. The pre-buffer circuits BFF0 to BFF10 transmit the output signals of the input distinguishing circuits IDC0 to IDC10 to the flip-flops FF0 to FF10. The post-buffer circuits BFF20 to BFF30 transmit the output signals of the flip-flops FF0 to FF10 to the output buffers OPB0 to OPB10. The buffer circuits BFF41 and 42 in two stages transmit the output signal of the input distinguishing circuit IDC11 to the output buffer OPB11.

V-PAD1 and V-PAD2 are power pads to be fed with supply voltage Vcc from the outside. VCL is a power supply line for distributing the supply voltage Vcc supplied to the power pads V-PAD1 and V-PAD2 to the internal circuits. The figure only shows the power supply line VCL feeding the input distinguishing circuits IDC0 to IDC11 from the power pads V-PAD1 and V-PAD2. It is needless to say, however, that the supply voltage is also supplied to the flip-flops and other internal circuits via the power supply line in the same manner. In addition, the power pads V-PAD1 and V-PAD2 are configured in such a way that supply voltage is fed to the power pads V-PAD1 and V-PAD2 from the external terminals of the packages via bonding wires.

Figure 3:
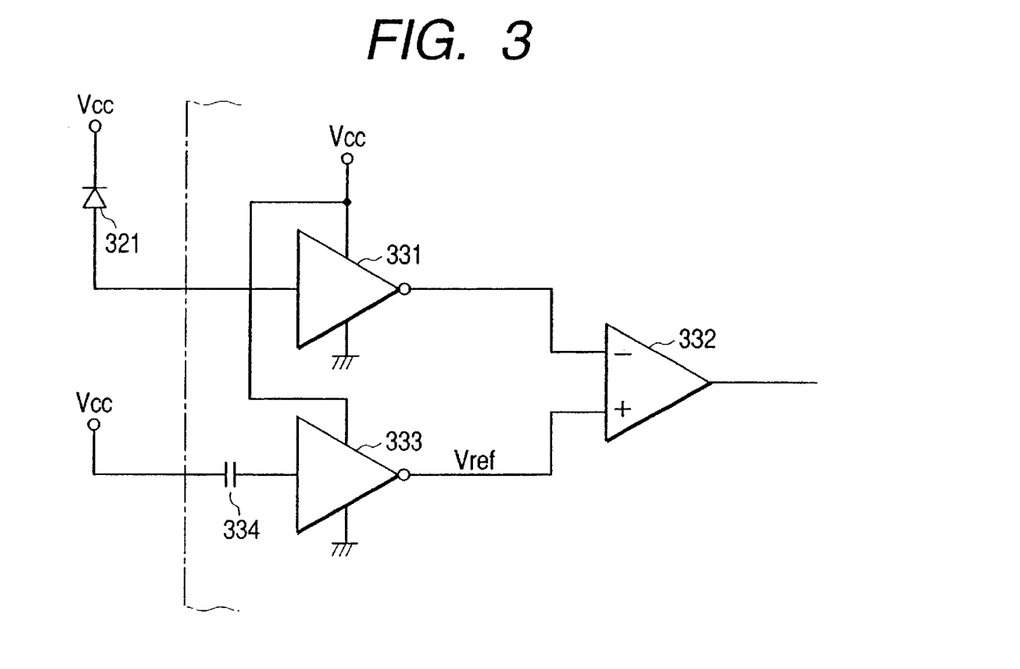
FIG. 3 is a circuit configuration diagram showing an embodiment of an input distinguishing circuit corresponding to one channel.
Figure 4:
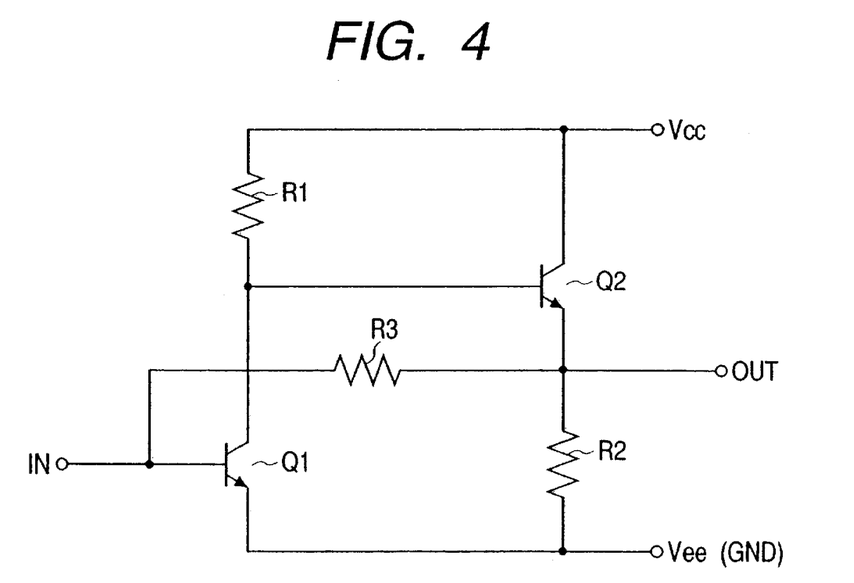
FIG. 4 is a circuit diagram showing a concrete example of a preamplifier and a reference amplifier.

FIG. 3 is a configuration diagram of a first embodiment of an input distinguishing circuit that corresponds to one channel. FIG. 4 is a circuit diagram showing a concrete example of a preamplifier circuit and a reference amplifier circuit which form the input distinguishing circuit. Incidentally, FIG. 3 shows one concrete example of the input distinguishing circuits IDC0 to IDC11 as shown in FIG. 2.

As shown in FIG. 3, this embodiment comprises a preamplifier 331 in which a photodiode 321 is connected between the supply voltage terminal Vcc and the input terminal, a comparator 332 comprising a differential amplification circuit that compares the output signal of the preamplifier 331 with reference voltage Vref, and a reference amplifier 333 for generating the reference voltage Vref. Furthermore, in this embodiment, a capacitance device 334 having a capacitance value equivalent to that of the photodiode 321 on the preamplifier side is connected between the input terminal of the reference amplifier 333 and the supply voltage terminal Vcc.

The preamplifier 331 is a current-input and voltage-output type amplifier circuit. A concrete example of the current-input and voltage-output type amplifier circuit is shown in FIG. 4. The preamplifier 331 comprises: a grounded-emitter type bipolar transistor Q1 with its base terminal connected to an input terminal IN; a collector resistance R1 connected between the collector terminal of the transistor Q1 and a supply voltage terminal Vcc; an emitter-follower transistor Q2 with its base connected to the collector terminal of the transistor Q1; an emitter resistance R2 connected between the emitter terminal of the transistor. Q2 and a grounding terminal GND; and a feedback resistance R3 connected between the emitter terminal of the transistor Q2 and the input terminal IN. The preamplifier 331 is configured in such a manner that a signal OUT resulting from the amplification of an input signal is outputted from the emitter terminal of the emitter-follower transistor Q2.

The grounded-emitter type bipolar transistor Q1 amplifies a current inputted from the input terminal IN to its base terminal, while the resistance R1 converts the collector current of the transistor Q1 to a voltage. The emitter follower that consists of the transistor Q2 and the resistance R2 functions as an impedance conversion circuit. The feedback resistance R3 provides the base bias point of the transistor Q1, that is, the feedback resistance R3 performs feedback in such a manner that the base potential of the transistor Q1 becomes the amplitude center potential of the output voltage OUT.

The amplifier in the embodiment shown in FIG. 4 operates in a stable manner even when the supply voltage Vcc is at a relatively low level of 3.3 V, for example. Also, the amplifier is capable of performing amplification for current input with a wide input range, such as a current amplitude range of 20 $\mu$A to 1 mA. It is capable of outputting a signal with an amplitude of 1 to 2 V at the maximum. Incidentally, the present embodiment uses an amplifier capable of performing amplification for current input with a wide input range, such as a current amplitude range of 20 $\mu$A to 1 mA, as described above, in order to deal with variations between devices in, for example, the photodiode array, the laser diode array of the transmission module, and the like, and to deal with decreases in the amplitude of input signals due to performance changes with time.

The reference amplifier 333 in FIG. 3 is configured with the same type of circuit as that of FIG. 4. With respect to the output voltage of the reference amplifier 333 or the reference voltage Vref of the comparator 332 in the next stage, a desired reference voltage Vref is obtained by setting the value of the emitter resistance R2 in the circuit shown in FIG. 4 to be different from that of the emitter resistance R2 in the preamplifier, and by adjusting the value of the emitter resistance R2 in the reference amplifier circuit. More specifically, in order to enable accurate distinguishing operation of the comparator 332 even when the amplitude of input current is small at 20 $\mu$A, for example, the value of the emitter resistance R2 is set in such a manner that the output level of the reference amplifier 333 coincides with the center level of the output signal of the preamplifier 331 when the current with an amplitude of about 20 $\mu$A is inputted to the preamplifier 331.

Incidentally, it can be readily inferred from the above description that an averaging circuit that detects the center level of the output of the preamplifier 331, such as a filter circuit, may be used as a means to provide reference voltage Vref to the comparator 332, instead of providing a reference amplifier having the type of circuit as shown in FIG. 3. However, in the case where an averaging circuit is used, the reference voltage generated by the averaging circuit could be indefinite if a direct current is inputted to the preamplifier 331. On the other hand, the present invention has the advantage of being able to provide a desired reference voltage Vref to the comparator 332 by using a reference amplifier having the same type of circuit as that of the preamplifier, as described above, even when the input current is direct current or is extremely close to it.

In the circuit embodiment shown in FIG. 3, the electric signal converted from an optical signal by the photodiode 321 is amplified by the preamplifier 331 and inputted to the comparator 332. The electric signal is then compared with the reference voltage Vref supplied from the reference amplifier 333 to be distinguished as "0" or "1". This means that the reference voltage Vref provides a threshold value of the input signal. The present embodiment offers high resistance to power supply noise because the amplifier 333 having the same type of circuit as that of the preamplifier 331 is used as a circuit for generating reference voltage Vref, as described above. Specifically, in the case where the reference amplifier 333 used for generating reference voltage Vref has the same type of circuit as that of the preamplifier 331, even if noise appears in the output of the preamplifier 331 due to the effect of the noise carried with the supply voltage Vcc, the same noise appears in the output of the reference amplifier 333, which is supplied with the common supply voltage. Therefore, the relative correlation between the inputs of the comparator 332 is not changed, and thus no effect of supply voltage noise appears in the output of the comparator 332.

Moreover, there is no fear in the present embodiment that the comparator 332 wrongly distinguishes an input signal. This is explained by the following reason. In the present embodiment, if noise in supply voltage caused by the input signal of another channel comes into the preamplifier 331 from the supply voltage terminal Vcc via the photodiode 321, the same supply voltage noise also comes into the reference amplifier 333 via the capacitance device 334. Therefore, the noises in the preamplifier 331 and the reference amplifier 333 are in phase with each other with respect to the input terminals of the comparator 332, and they cancel out each other.

Figure 10B:
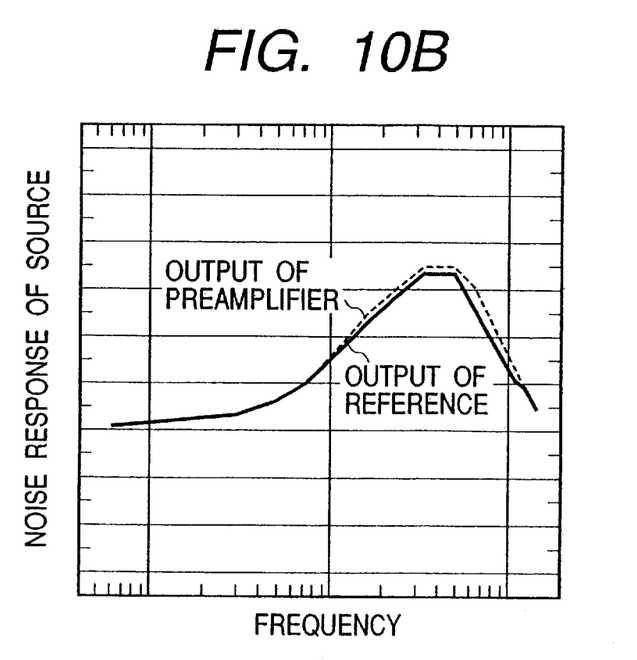
FIG. 10B is a characteristic description graph showing the frequency response characteristics of a preamplifier and a reference amplifier constituting an input distinguishing circuit in a receiving circuit of an embodiment of the present invention.

FIG. 10B shows the frequency response characteristics of the preamplifier and the reference amplifier comprising the input distinguishing circuit of the present embodiment in the receiving IC. In the figure, a dotted line denotes the frequency characteristics of the output of the preamplifier, while a solid line denotes the frequency characteristics of the output of the reference amplifier. FIG. 10A, on the other hand, shows the frequency response characteristics of a preamplifier and a reference amplifier in the conventional type input distinguishing circuit shown in FIG. 9 in which no equivalent capacitance is connected to the input terminal of the reference amplifier. It is clear from the comparison of FIG. 10B with FIG. 10A that the frequency response characteristics of the reference amplifier can be made closer to the frequency response characteristics of the preamplifier by applying the present embodiment. Thus the present embodiment allows an input signal to be distinguished as "0" or "1" more accurately.

Next, the concrete structure of the above capacitance device 334 connected to the input terminal of the reference amplifier 333 will be described with reference to FIGS. 5 to 7.

Figure 5:
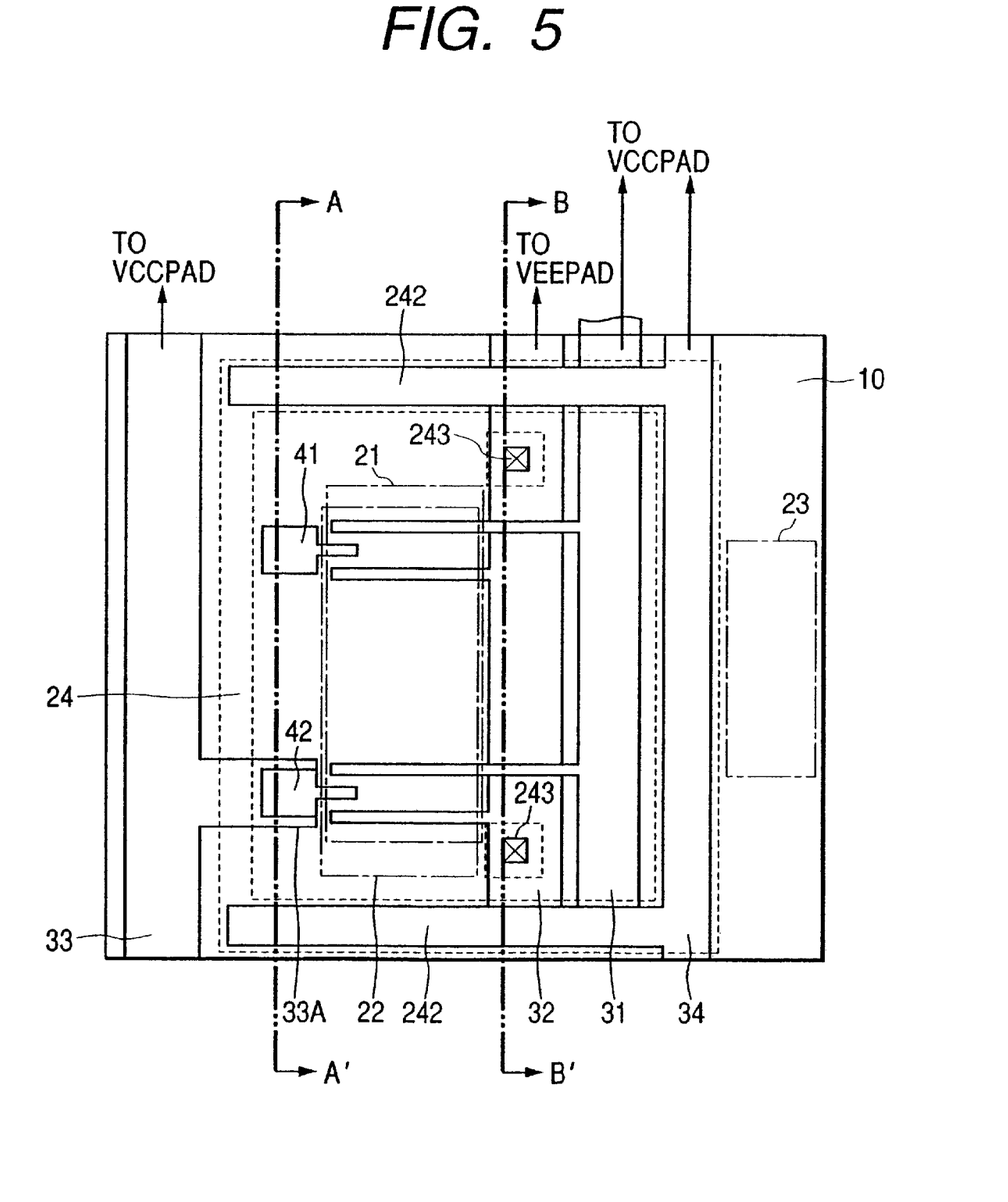
FIG. 5 is a layout description diagram showing an example of a layout in which the input distinguishing circuit corresponding to one channel as shown in FIG. 3 is formed on a semiconductor chip.

FIG. 5 shows a layout example where the circuit as shown in FIG. 3 is formed on a semiconductor chip. In FIG. 5, reference numeral 10 denotes a semiconductor chip consisting of a single-crystal silicon substrate and the like. Reference numeral 21 denotes a region where devices comprising a preamplifier 331 are formed. Reference numeral 22 denotes a region where devices comprising a reference amplifier 333 are formed. Reference numeral 23 denotes a region where devices comprising a comparator 332 are formed. Reference numeral 24 denotes a guard ring region formed in such a way as to surround the outside of the regions 21 and 22 for forming the above amplifiers 331 and 333, in order to prevent the entry of leak current and the like from regions formed by other devices.

In FIG. 5, the regions 21 and 22 overlap with each other. This indicates that devices comprising the preamplifier 331 and devices comprising the reference amplifier 333 are arranged in such a manner as to mingle with one another. The variations between the devices comprising the preamplifier 331 and the devices comprising the reference amplifier 333 can be made to be the same by arranging them in the above manner.

In addition, reference numeral 31 denotes a power supply line for supplying a supply voltage Vcc of 3.3 V, for example, to the above amplifiers 331 and 333. Reference numeral 32 denotes a power supply line for supplying a supply voltage Vee such as a ground potential (0 V) to the above amplifiers 331 and 333. Reference numeral 33 denotes a power supply line for supplying the supply voltage Vcc to one terminal of the above capacitance device 334 connected to the input terminal of the reference amplifier 333. Reference numeral 34 denotes a power supply line for supplying the supply voltage Vcc to be applied to the above guard ring region 24. Furthermore, reference numeral 41 denotes a signal input pad connected to the input terminal of the above preamplifier 331. Reference numeral 42 denotes, a dummy input pad connected to the input terminal of the above reference amplifier 333.

In the present embodiment, the power supply line 33 is formed in an aluminum wiring layer in the first layer along the edge of the semiconductor chip 10, which forms the receiving circuit, by using multi-layer wiring technology. That is, the power supply line 33 is formed in a region outside of where the signal input pad 41 and the dummy input pad 42 are formed on the semiconductor chip 10. A part of the power supply line 33 is provided with a section 33A which extends to the input terminal side of the reference amplifier 333. The dummy input pad 42 consisting of an aluminum wiring layer in the third layer, which is connected to the reference amplifier 333, is placed opposite to the redundant section 33A with an insulating film intermediate between the dummy input pad 42 and the redundant section 33A. As a result, the equivalent capacitance connected to the input terminal of the reference amplifier 333 is formed.

This makes it possible to make the receiving module more compact in configuration than when an external capacitor is used as equivalent capacitance connected to the input terminal of the reference amplifier. As in the case of the circuit embodiment shown in FIG. 3, the equivalent capacitance described above is effective especially when it is applied to a module that receives multi-channel optical signals.

Figure 6:
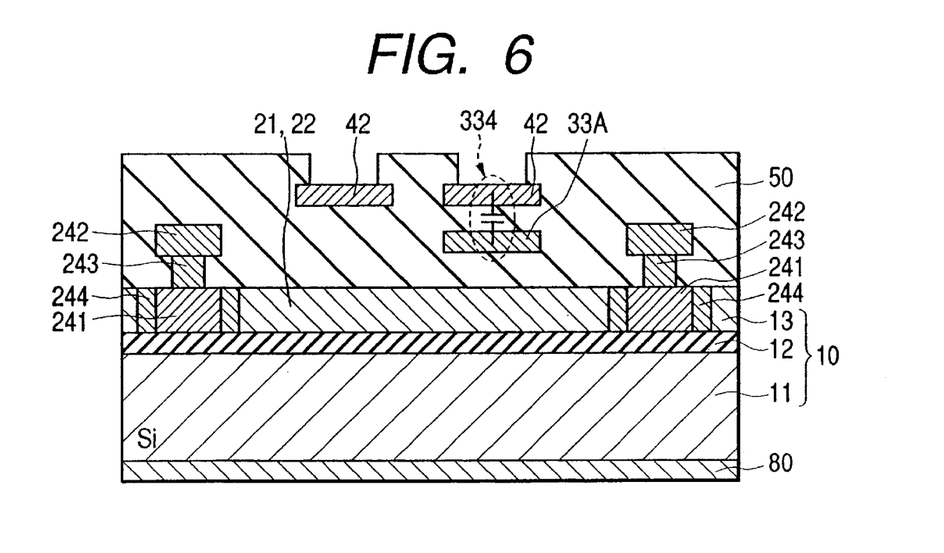
FIG. 6 is a sectional view of the structure shown in FIG. 5, taken along the A–A' line of FIG. 5.

FIG. 6 is a sectional view of the configuration shown in FIG. 3, taken along an A–A' line. In FIG. 6, sections provided with the same reference numerals as those in FIG. 3 denote the same components as shown in FIG. 3. FIG. 6 clearly shows that an equivalent capacitance device 334 connected to the input terminal of the reference amplifier 333 is formed by placing the section 33A extended from the power supply line 33 and the dummy input pad 42 opposite to each other with an insulating film intermediate between the dummy input pad 42 and the section 33A.

As shown in FIG. 6, an SOI substrate is used in the present embodiment as a semiconductor chip 10 on which the receiving circuit is formed. In the SOI substrate, a single-crystal silicon layer 13 is formed on a support substrate 11 such as silicon, which serves as the base, with an insulating film 12 intermediate between the support substrate 11 and the single-crystal silicon layer 13. An typical example of a support substrate for a SOI substrate is a silicon substrate. Reference numeral 241 denotes a guard ring region consisting of a high-density diffusion layer formed on the single-crystal silicon layer 13. Reference numeral 242 denotes a feeding layer for applying supply voltage Vcc to the guard ring region 241. Reference numeral 243 denotes a contact hole for electrically connecting the feeding layer 242 and the guard ring region 241 to each other.

On the periphery of the guard ring region 241 consisting of the diffusion layer, there is provided a so-called U-groove isolation region 244, which is formed by creating a groove in the single-crystal silicon layer 13 and filling the groove with an insulator or the like. The U-groove isolation region 244 electrically isolates the guard ring region 241 consisting of the diffusion layer and the device forming regions 21 and 22 from each other. In the present embodiment, the feeding layer 242 is formed by the same aluminum wiring layer in the first layer as that of the redundant section 33A, which forms the equivalent capacitance, though it is not expressly limited to this case. Specifically, it should be added that the concrete example shown here is not intended to expressly limit the present invention. Incidentally, the single-crystal silicon layer 13, the wiring layers 33A and 242, and the pads 41 and 42 are isolated from one another by an insulating film 50 of silicon oxide, for example.

Figure 7:
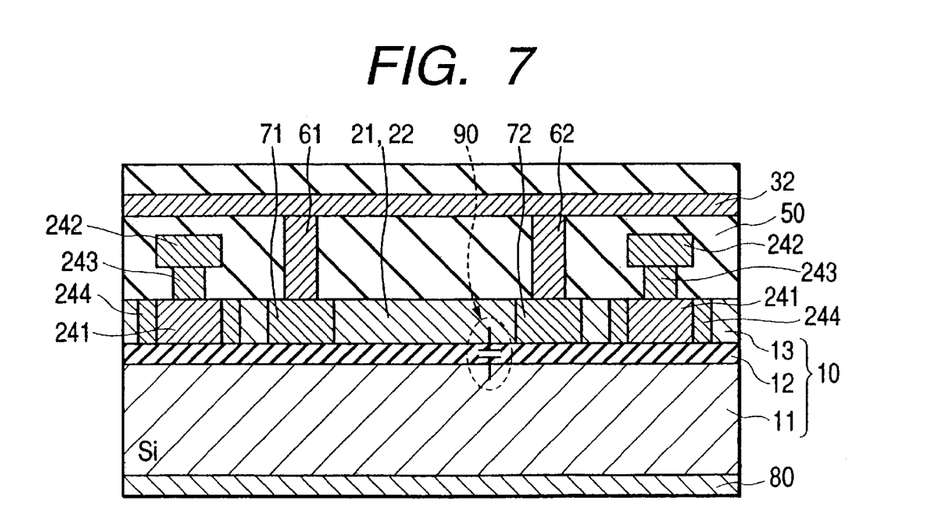
FIG. 7 is a sectional view of the structure shown in FIG. 5, taken along the B–B' line of FIG. 5.

FIG. 7 is a sectional view of the configuration shown in FIG. 3, taken along a B–B' line. As shown in FIG. 7, in the present embodiment, contact holes 61 and 62 for applying supply voltage Vee fed by the power supply line 32 are formed in the insulating film 50 on the regions 21 and 22. In the regions 21 and 22, devices comprising the preamplifier 331 and the reference amplifier 333 are formed in the single-crystal silicon layer 13 in the surface of the SOI substrate 10. In the present embodiment, the power supply line 32 for supplying the supply voltage Vee is formed by an aluminum wiring layer in the second layer. Also, in the regions 21 and 22 in the single-crystal silicon layer 13 where devices comprising the preamplifier 331 and the reference amplifier 333 are formed, there are provided high-density diffusion regions 71 and 72 for providing ohmic contact between electric conductors (aluminum) in the contact holes 61 and 62 and the device forming regions 21 and 22.

In the meantime, a metal layer 80 consisting of aluminum and the like is formed on the surface of the base substrate 11 on the underside of the SOI substrate 10. Supply voltage Vcc is applied to the metal layer 80. This allows the capacitance formed between the base substrate 11 and the device forming regions 21 and 22 to function as a bypass capacitor 90 to stabilize supply voltage.

Moreover, in such a multi-channel receiving circuit as the present embodiment, amplifiers for each channel will be formed in a region with relatively large room. This should be sufficiently understood from FIG. 8B. In FIG. 8B, pads PAD0 to PAD11 are provided as input terminals in accordance with the pitch of each diode in a photodiode array 320, and preamplifiers 331 and reference amplifiers 333 are arranged in accordance with the pads. PAD0 to PAD11. Thus, the capacitance formed between the base substrate 11 and the device forming regions 21 and 22 that form the reference amplifier in the SOI substrate has a relatively large capacitance value large enough for the capacitance to function as a bypass capacitor. Therefore, according to the present embodiment, it is possible to realize a bypass capacitor having a large capacitance value without increasing the original chip size, and stabilize the supply voltage of the present module.

Incidentally, the bypass capacitor described above is not limited to the capacitance formed between the base substrate 11 and the regions 21 and 22 for forming the preamplifier 331 and the reference amplifier 333. The bypass capacitor may be the capacitance formed between the base substrate 11 and the regions where devices comprising the comparator 332, buffers, flip-flops and other circuits are formed.

Figure 8A:
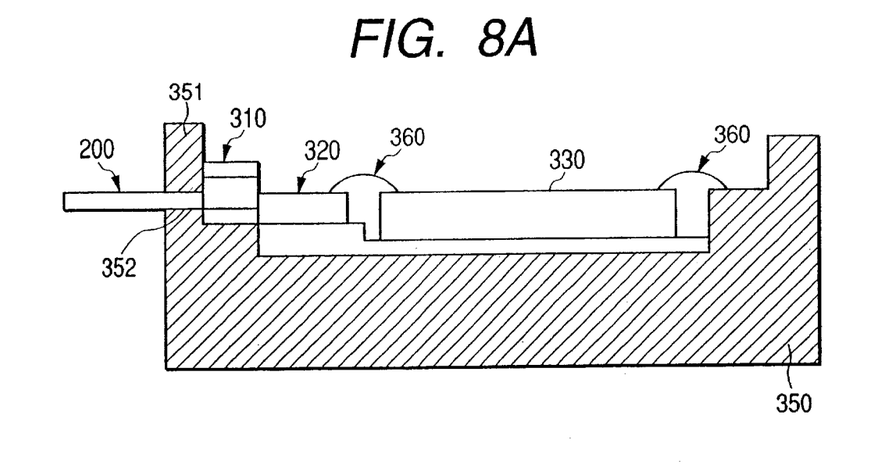
FIG. 8A is a sectional view of a configuration of an optical signal receiving module incorporating a receiving IC according to the present invention.
Figure 8B:
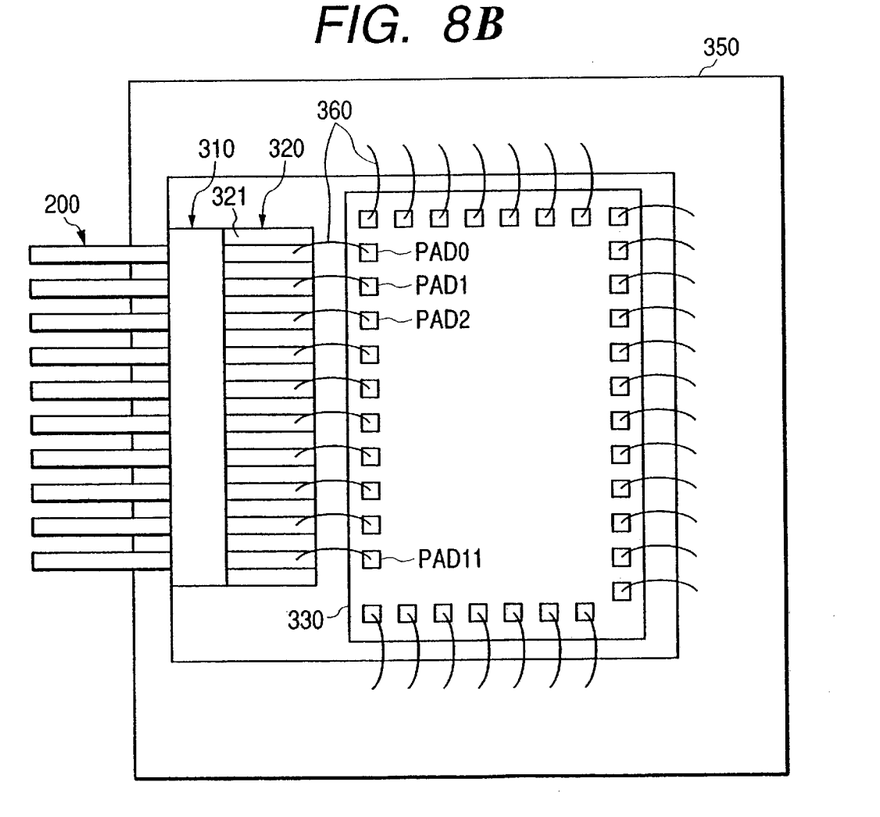
FIG. 8B is a plan view of a configuration of an, optical signal receiving module incorporating a receiving IC according to the present invention.

FIG. 8A is a sectional view of a configuration of an optical signal receiving module incorporating a receiving IC according to the present invention. FIG. 8B is a plan view of the configuration of the optical signal receiving module. As shown in FIG. 8A, a receiving IC 330 is fixed at the center of a package 350 made of plastic or ceramics with an adhesive or the like. A photodiode array 320 is placed on the input terminal side of the receiving IC 330, and is similarly fixed on the package 350 with an adhesive or the like. In this case, each diode in the photodiode array 320 is positioned in such a manner as to face opposite to one of the signal input pads PAD0 to PAD11 provided for the receiving IC on a one-to-one basis. The photodiode is connected the corresponding input pad by a bonding wire 360.

In addition, a plurality of through holes 352 with nearly the same diameter as that of an optical fiber are formed in a side wall 351 on the photodiode array placing side of the package 350. One end of an optical fiber 200 is inserted into the through hole 352 and fixed. A microlens array 310 that collects the light of the optical signal transmitted by the optical fiber 200 and makes the light incident on the corresponding photodiode is placed between the photodiode array 320 and the side wall 351 of the package 350 where the optical fiber is fixed. The microlens array 310 is fixed on the package 350 with an adhesive or the like.

The invention provided by the present inventor is described above in a concrete manner based on the embodiments. It is needless to say, however, that the present invention is not limited to the embodiments described above and that various changes may be made so long as they do not depart from the subject matter of the present invention.

For example, in the embodiments described above, the equivalent capacitance 334 is provided between the input terminal of the reference amplifier 333 and the supply voltage terminal. However, a dummy diode with the same characteristics as those of the photodiode may be connected instead of the equivalent capacitance. Even in this case, as in the circuit of the first embodiment, the cross talk noise coming into the preamplifier 331 side and the cross talk noise coming into the reference amplifier 333 side are inputted to the comparator 332 while in phase with each other, so that they cancel out each other. Therefore, the wrong distinguishing operation of the comparator 332 can be prevented.

Furthermore, in the case where a dummy diode is provided, it is also possible to stabilize supply voltage by applying the structure shown in FIG. 7, that is, forming a bypass capacitor between the base substrate and the active region where the preamplifier and the reference amplifier constituting the input distinguishing circuit are formed.

Incidentally, in the case where a dummy diode is provided, there is no need to provide an optical fiber or a microlens on the dummy diode side. On the other hand, some devices are necessary in this case such as providing a light-blocking mask so that the optical signal incident on the real photodiode for photoelectric conversion adjacent to the dummy diode will not be leaked and made incident on the dummy diode.

The effects obtained by the typical embodiments of the present invention disclosed herein are briefly described as follows.

According to the present invention, in an optical interconnection receiving module for receiving multi-channel optical signals, the effect of cross talk noise caused by the input signal of another channel can be cancelled out by the preamplifier side and the reference amplifier side, thereby making it possible to accurately distinguish input signals. Moreover, it is possible to obtain suitable device structures for a bypass capacitor used to stabilize supply voltage and for a capacitance device used to cancel out the effect of cross talk noise caused by the input signal of another channel on the preamplifier side and on the reference amplifier side.

Therefore, the size of the optical interconnection receiving module can be reduced.

In order to facilitate understanding of the accompanying drawings, main reference numerals are described as follows:

100: transmission module, 110: semiconductor integrated circuit for transmission module
120: laser diode array, 130: microlens array,
200: optical fiber array, 30: optical interconnection receiving module,
320: photodiode array, 330: semiconductor integrated circuit for receiving module,
331: preamplifier, 332a comparator., 333: reference amplifier,
334: equivalent capacitance device, 350: package, 360: bonding wire,
10: semiconductor chip (or 011 substrate semiconductor chip), 21: preamplifier device forming region, 22: reference amplifier device forming region, 23: comparator device forming region, 24: guard ring region, 31, 33, and
34: power supply line for supplying Vcc, 32: power supply line for supplying Vee, 41: signal input pad, 42: dummy input pad, 90: bypass capacitor, IDC: input distinguishing circuit, V-PAD: power pad, PAD0 to PAD11: signal input pad.

What is claimed is:

1. An optical interconnection receiving module comprising:
   a plurality of photodiodes, each of which receives an optical signal on a channel and converts the optical signal into an electrical signal;
   at least one power pad;
   a power supply line coupled to said at least one power pad; and
   a plurality of sets, each set comprising:
      a first amplifier for amplifying the electrical signal converted by one of said photodiodes;
      a determining circuit for determining the signal amplified by said first amplifier based on a reference voltage;
      a reference voltage generating circuit for generating the reference voltage, and
      a capacitance device formed between said reference voltage generating circuit and said at least one power pad;
   wherein each of said plurality of sets of said first amplifier, said determining circuit, said reference voltage generating circuit and said capacitance device a reformed on a single semiconductor chip along with said power supply line and said at least one power pad; and
   wherein each of said first amplifier and said reference voltage generating circuit are electrically connected to said at least one power pad through said power supply line.

2. An optical interconnection receiving module as claimed in claim 1, wherein said capacitance device is connected to the input of said reference voltage generating circuit, and said reference voltage generating circuit includes a second amplifier for outputting said reference voltage from an output of said reference voltage generating circuit.

3. An optical interconnection receiving module as claimed in claim 2, wherein each of said plurality of capacitance devices comprises a capacitance device equivalent to said photodiode.

4. An optical interconnection receiving module as claimed in claim 3, wherein said second amplifier has the same type of circuit as that of said first amplifier, and said determining circuit includes a comparator for receiving a signal from said first amplifier and said reference voltage.

5. An optical interconnection receiving module comprising:
   a plurality of photodiodes, each of which receives an optical signal on a channel and converts the optical signal into an electrical signal;
   at least one power pad;
   a power supply line coupled to said at least one power pad; and
   a plurality of sets, each set comprising:
      a first amplifier for amplifying the electrical signal converted by one of said photodiodes;
      a determining circuit for determining the signal amplified by said first amplifier based on a reference voltage;
      a reference voltage generating circuit for generating the reference voltage; and
      a capacitance device formed between said reference voltage generating circuit and said at least one power pad;
   wherein each of said plurality of sets of said first amplifier, said determining circuit, said reference voltage generating circuit and said capacitance device are formed on a single semiconductor chip along with said power supply line and said at least one power pad; and
   wherein each of said first amplifier and said reference voltage generating circuit are electrically connected to said at least one power pad through said power supply line; and
   wherein said reference voltage generating circuit includes a second amplifier having an input terminal and an output terminal, said capacitance device being coupled to said input terminal, said reference voltage being output from said output terminal,
   wherein said power supply line comprises a first wiring layer and a second wiring layer, said first wiring layer provided along an edge of the semiconductor chip in a region outside of where a signal input pad is formed on the semiconductor chip on which a receiving circuit including said first amplifier and said second amplifier are formed;
   wherein said second wiring layer extends to the input terminal of said second amplifier; and
   wherein said capacitance device is formed by placing a pad, which is connected to said second amplifier and is comprised in said second wiring layer different from said first wiring layer, in such a manner as to face opposite to an extended section of said power supply line extended to the input terminal of said second amplifier with an insulating film intermediate between said pad and said extended section of said power supply line.

6. An optical interconnection receiving module comprising:
   a plurality of photodiodes, each of which receives an optical signal on a channel and converts the optical signal into an electrical signal;
   at least one power pad;
   a power supply line coupled to said at least one power pad; and
   a plurality of sets, each set comprising:
      a first amplifier for amplifying the electrical signal converted by one of said photodiodes;

a determining circuit for determining the signal amplified by said first amplifier based on a reference voltage, a reference voltage generating circuit for generating the reference voltage, and a capacitance device formed between said reference voltage generating circuit and said at least one power pad, wherein each of said plurality of sets of said first amplifier, said determining circuit, said reference voltage generating circuit and said capacitance device are formed on a single semiconductor chip along with said power supply line and said at least one power pad, and wherein each of said first amplifier and said reference voltage generating circuit are electrically connected to said at least one power pad through said power supply line, and wherein said reference voltage generating circuit includes a second amplifier having an input terminal and an output terminal, said capacitance device being coupled to said input terminal, said reference voltage being output from said output terminal;

wherein as a semiconductor chip on which a receiving circuit including said first amplifier and second amplifier is formed, an SOI substrate is used that includes a multi-layer structure of a substrate, an insulating film, and a semiconductor layer, said semiconductor layer being provided where the receiving circuit is formed; and wherein a first supply voltage terminal is connected to said substrate, and a second supply voltage terminal is connected to a semiconductor region where devices comprising said receiving circuit are formed;

wherein the capacitance device formed between said semiconductor region and said substrate is configured to function as a bypass capacitor.

7. An optical interconnection receiving module as claimed in claim 5, wherein as the semiconductor chip on which the receiving circuit including said first amplifier and said second amplifier is formed, an SOI substrate is used that includes a multi-layer structure of a substrate, an insulating film, and a semiconductor layer, said semiconductor layer being provided where the receiving circuit is formed; and wherein a first supply voltage terminal is connected to said substrate, and a second supply voltage terminal is connected to a semiconductor region where devices comprising said receiving circuit are formed;

whereby the capacitance formed between said semiconductor region and said substrate is configured to function as a bypass capacitor.

8. An optical interconnection receiving module as claimed in claim 2, wherein said first amplifier and said second amplifier are formed by a current-input and voltage-output type amplifier circuit comprising:

a grounded-emitter type bipolar transistor with the base terminal thereof connected to a signal input terminal;

a collector resistance connected between the collector terminal of said transistor and a first supply voltage terminal;

an emitter-follower transistor with the base thereof connected to the collector terminal of said transistor;

an emitter resistance connected between the emitter terminal of said emitter-follower transistor and a second supply voltage terminal; and a feedback resistance connected between the emitter terminal of said emitter-follower transistor and said signal input terminal.

9. An optical interconnection receiving module as claimed in claim 3, wherein said first amplifier and said second amplifier are formed by a current-input and voltage-output type amplifier circuit comprising:

a grounded-emitter type bipolar transistor with the base terminal thereof connected to a signal input terminal;

a collector resistance connected between the collector terminal of said transistor and a first supply voltage terminal;

an emitter-follower transistor with the base thereof connected to the collector terminal of said transistor;

an emitter resistance connected between the emitter terminal of said emitter-follower transistor and a second supply voltage terminal; and a feedback resistance connected between the emitter terminal of said emitter-follower transistor and said signal input terminal.

10. An optical interconnection receiving module as claimed in claim 5, wherein said first amplifier and said second amplifier are formed by a current-input and voltage-output type amplifier circuit comprising:

a grounded-emitter type bipolar transistor with the base terminal thereof connected to a signal input terminal;

a collector resistance connected between the collector terminal of said transistor and a first supply voltage terminal;

an emitter-follower transistor with the base thereof connected to the collector terminal of said transistor;

an emitter resistance connected between the emitter terminal of said emitter-follower transistor and a second supply voltage terminal; and a feedback resistance connected between the emitter terminal of said emitter-follower transistor and said signal input terminal.

11. An optical interconnection receiving module as claimed in claim 6, wherein said first amplifier and said second amplifier are formed by a current-input and voltage-output type amplifier circuit comprising:

a grounded-emitter type bipolar transistor with the base terminal thereof connected to a signal input terminal;

a collector resistance connected between the collector terminal of said transistor and a first supply voltage terminal;

an emitter-follower transistor with the base thereof connected to the collector terminal of said transistor;

an emitter resistance connected between the emitter terminal of said emitter-follower transistor and a second supply voltage terminal; and a feedback resistance connected between the emitter terminal of said emitter-follower transistor and said signal input terminal.

12. An optical interconnection receiving module as claimed in claim 8, wherein a microlens array with a plurality of lenses that are capable of collecting the light of a received optical signal for each photodiode and irradiating the photodiode with the light is provided in the proximity of said photodiode array.

13. An optical interconnection receiving module as claimed in claim 9, wherein a microlens array with a plurality of lenses that are capable of collecting the light of a received optical signal for each photodiode and irradiating the photodiode with the light is provided in the proximity of said photodiode array.

14. An optical interconnection receiving module as claimed in claim 10, wherein a microlens array with a plurality of lenses that are capable of collecting the light of a received optical signal for each photodiode and irradiating the photodiode with the light is provided in the proximity of said photodiode array.

15. An optical interconnection receiving module as claimed in claim 11, wherein a microlens array with a plurality of lenses that are capable of collecting the light of a received optical signal for each photodiode and irradiating the photodiode with the light is provided in the proximity of said photodiode array.

16. An optical interconnection receiving module as claimed in claim 12, wherein a fiber fixing section for fixing one end of an optical fiber is provided for said microlens array in one section of a package where said photodiode array and said receiving circuit are mounted.

17. An optical interconnection receiving module as claimed in claim 13, wherein a fiber fixing section for fixing one end of an optical fiber is provided for said microlens array in one section of a package where said photodiode array and said receiving circuit are mounted.

18. An optical interconnection receiving module as claimed in claim 14, wherein a fiber fixing section for fixing one end of an optical fiber is provided for said microlens array in one section of a package where said photodiode array and said receiving circuit are mounted.

19. An optical interconnection receiving module as claimed in claim 15, wherein a fiber fixing section for fixing one end of an optical fiber is provided for said microlens array in one section of a package where said photodiode array and said receiving circuit are mounted.

20. An optical interconnection receiving module as claimed in claim 4, wherein a first one of said at least one power pad and a second one of said at least one power pad are formed such that the first one of said at least one power pad is formed on one side of said power supply line and the second one of said at least one power pad is formed on the other side of said power supply line.

* * * * *